United States Patent
Mirpuri

(10) Patent No.: US 11,721,642 B2
(45) Date of Patent: Aug. 8, 2023

(54) SEMICONDUCTOR DEVICE PACKAGE CONNECTOR STRUCTURE AND METHOD THEREFOR

(71) Applicant: NXP USA, INC., Austin, TX (US)

(72) Inventor: Kabir Mirpuri, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 16 days.

(21) Appl. No.: 17/350,190

(22) Filed: Jun. 17, 2021

(65) Prior Publication Data

US 2022/0406728 A1    Dec. 22, 2022

(51) Int. Cl.
| | |
|---|---|
| *H01L 23/00* | (2006.01) |
| *H01L 23/31* | (2006.01) |
| *H01L 23/498* | (2006.01) |

(52) U.S. Cl.
CPC ........ *H01L 23/562* (2013.01); *H01L 23/3114* (2013.01); *H01L 23/49816* (2013.01); *H01L 24/49* (2013.01); *H01L 2224/05014* (2013.01); *H01L 2224/10155* (2013.01); *H01L 2924/15311* (2013.01); *H01L 2924/18161* (2013.01)

(58) Field of Classification Search
CPC .................. H01L 23/3114; H01L 24/49; H01L 23/49816; H01L 2224/10155; H01L 2924/15311; H01L 2924/18161
See application file for complete search history.

(56) References Cited

U.S. PATENT DOCUMENTS

| | | | |
|---|---|---|---|
| 7,604,154 B2 | 10/2009 | Matsumoto et al. | |
| 7,969,024 B2 | 6/2011 | Chung et al. | |
| 9,230,932 B2 | 1/2016 | Yu et al. | |
| 10,163,827 B1 | 12/2018 | Tsao et al. | |
| 2004/0027788 A1 | 2/2004 | Chiu et al. | |
| 2004/0134974 A1 | 7/2004 | Oh et al. | |
| 2009/0065943 A1 | 3/2009 | Rothman et al. | |
| 2009/0174069 A1 | 7/2009 | Nguyen et al. | |
| 2011/0095423 A1* | 4/2011 | Ohashi ............. | H01L 23/49816 257/737 |
| 2011/0266670 A1 | 11/2011 | England et al. | |
| 2017/0053858 A1 | 2/2017 | Krajniak et al. | |

FOREIGN PATENT DOCUMENTS

| | | |
|---|---|---|
| DE | 102017208628 A1 | 11/2018 |
| KR | 100444163 B1 | 8/2004 |

* cited by examiner

*Primary Examiner* — Jasmine J Clark

(57) ABSTRACT

A packaged semiconductor device is provided. The packaged semiconductor device includes a semiconductor die affixed to a package substrate. A conductive connector is affixed to the package substrate. A collar is formed around a perimeter of the conductive connector at a conductive connector to package substrate transition. A reinforcement structure is embedded in the collar. The reinforcement structure substantially surrounds the conductive connector at the conductive connector to package substrate transition.

20 Claims, 9 Drawing Sheets

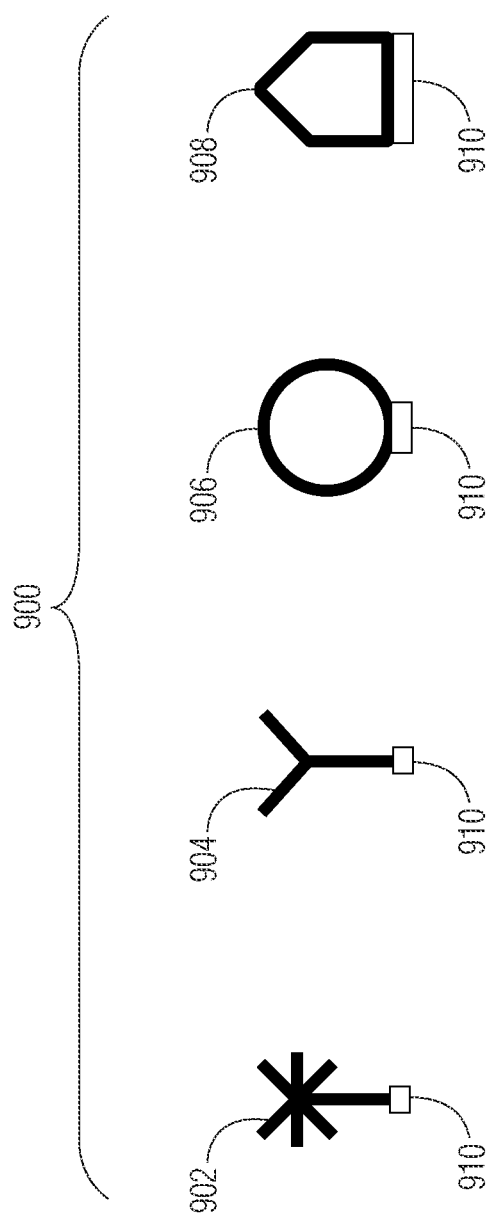

SEMICONDUCTOR DEVICE PACKAGE CONNECTOR STRUCTURE AND METHOD THEREFOR

BACKGROUND

Field

This disclosure relates generally to semiconductor device packaging, and more specifically, to a semiconductor device package connector structure and method of forming the same.

Related Art

Today, there is an increasing trend to include sophisticated semiconductor devices in products and systems that are used every day. In applications from sewing machines to washing machines, from automobiles to cellular telephones, and so on, many of these semiconductor devices are produced in high volumes to drive costs down. Factors such as manufacturing processes may be optimized for high volumes but could adversely affect yield and reliability thus impacting product costs. As technology progresses, semiconductor manufacturers continue to seek ways to improve yield and reliability in these semiconductor devices while keeping product costs in focus.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 9 illustrates, in simplified cross-sectional views, example reinforcement structures in accordance with an embodiment.

DETAILED DESCRIPTION

Generally, there is provided, a semiconductor device package having a reinforced connector structure and method. A joint protection paste is applied to connector pads of a package substrate and ring-like reinforcement structures are placed onto the package substrate to substantially encircle the joint protection paste and respective connector pads. Conductive connectors are placed onto the joint protection paste. A heat treatment is applied to the device package to reflow the joint protection paste and to form a conductive bond between the conductive connectors and the connector pads. A rigid collar with embedded reinforcement structure is formed around a perimeter of each conductive connector. By reinforcing the connector structures in this manner, device package reliability is improved.

Figure 1:
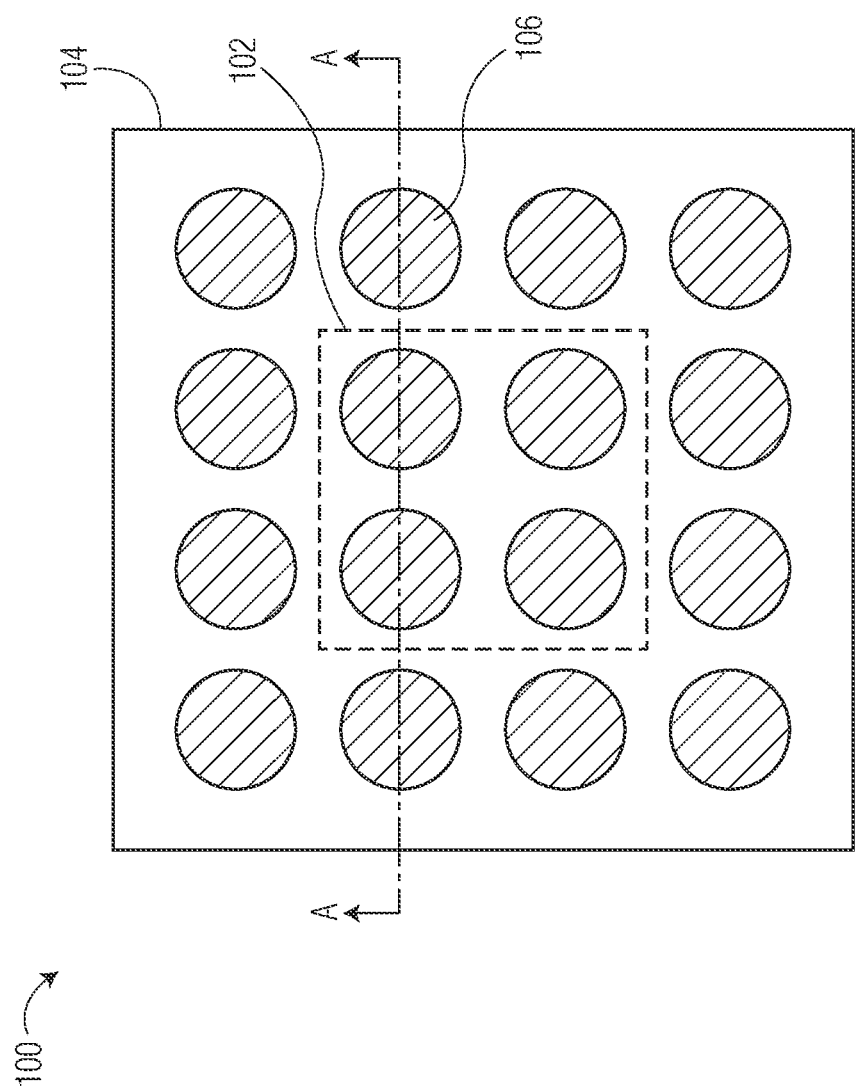
FIG. 1 illustrates, in a simplified bottom-side-up plan view, an example packaged semiconductor device in accordance with an embodiment.

FIG. 1 illustrates, in a simplified bottom-side-up plan view, an example packaged semiconductor device 100 at a final stage of manufacture in accordance with an embodiment. At this stage of manufacture, the device 100 includes a semiconductor die 102, a package substrate 104, and conductive connectors 106 affixed to the package substrate 104. In this embodiment, the semiconductor die, depicted as a dashed-outline for reference, is affixed at an opposite side of the package substrate 104. The device 100 is depicted having 16 conductive connectors 106 arranged in a grid on the package substrate 104, for example. The number and arrangement of the conductive connectors 106 are chosen for illustration purposes. Cross-sectional views of the packaged semiconductor device 100 taken along line A-A at stages of manufacture are depicted in FIG. 2 through FIG. 6.

The semiconductor die 102 has an active side (e.g., major side having circuitry, bond pads) and a backside (e.g., major side opposite of the active side). In this embodiment, the semiconductor die 102 is configured in a flip-chip orientation having the active side mounted on the package substrate 104. The semiconductor die 102 may be formed from any suitable semiconductor material, such as silicon, germanium, gallium arsenide, gallium nitride, and the like. Semiconductor die 102 may further include any digital circuits, analog circuits, RF circuits, memory, processor, the like, and combinations thereof at the active side.

The package substrate 104 has a top side and a bottom side (e.g., major side opposite of the top side). As depicted in the bottom-side-up plan view of FIG. 1, the conductive connectors 106 are mounted at the bottom side of the package substrate 104, for example. The conductive connectors 106 may be characterized as input/output and power supply connectors, for example. The conductive connectors 106 may be formed in any suitable conductive connector structures such as solder balls, gold studs, copper pillars, and the like. In this embodiment, the conductive connectors 106 are formed as ball connectors, for example, and arranged in a ball grid array (BGA). The package substrate 104 is formed as a multi-layer laminate structure having conductive features (e.g., metal traces, pads) separated by non-conductive material (e.g., FR-4). In this embodiment, the package substrate 104 may be characterized as a chip scale package (CSP) or a BGA type package substrate.

Figure 2:
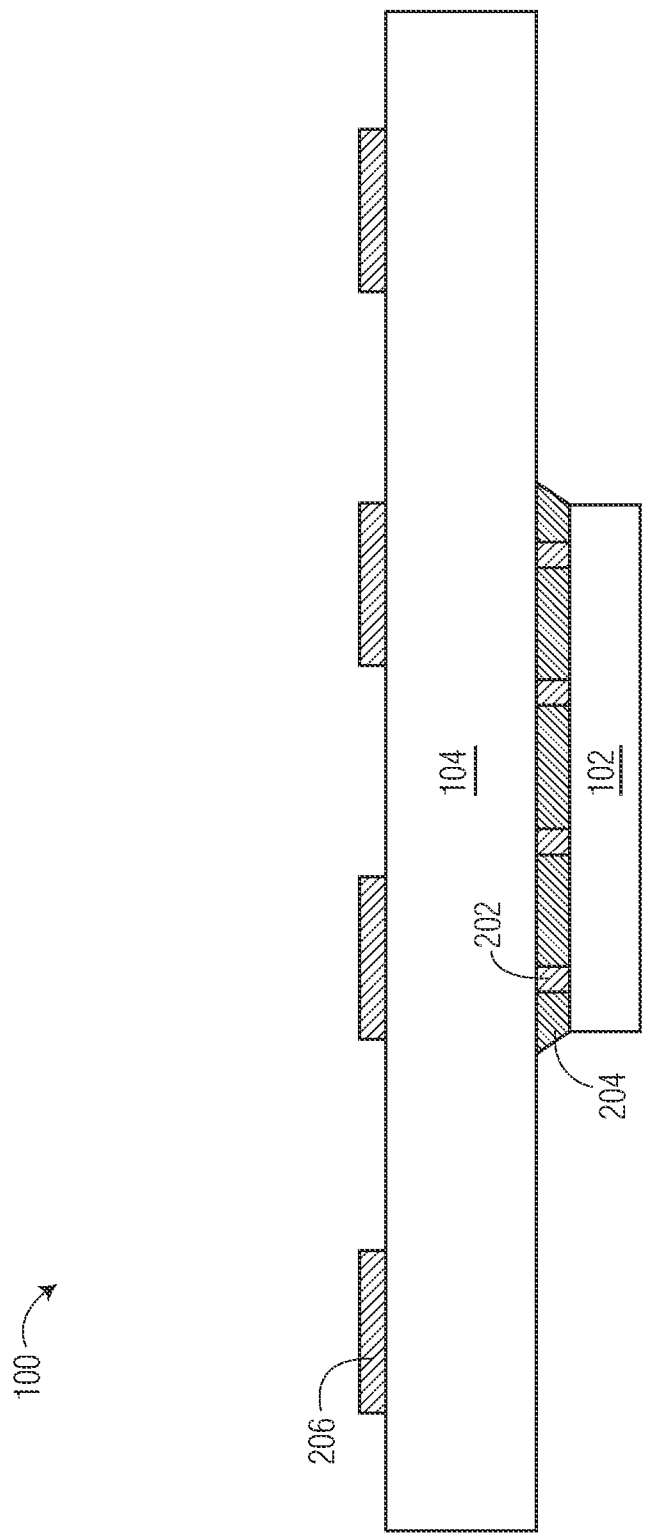
FIG. 2 through FIG. 6 illustrate, in simplified cross-sectional views, the example packaged semiconductor device of FIG. 1 at stages of manufacture in accordance with an embodiment.

FIG. 2 through FIG. 6 illustrate, in simplified cross-sectional views, the example packaged semiconductor device of FIG. 1 at stages of manufacture in accordance with an embodiment FIG. 2 illustrates, in a simplified bottom-side-up cross-sectional view, the example packaged semiconductor device 100 at a stage of manufacture in accordance with an embodiment. At this stage, the device 100 includes the active side of the semiconductor die 102 interconnected with the top side of the package substrate 104 by way of conductive die connectors 202 and underfilled with an epoxy material 204. The die connectors 202 may be any suitable die connector structure such as solder bumps, gold studs, copper pillars, copper pillars with solder tips, and the like. Features such as bond pads on the semiconductor die 102 and corresponding pads on the package substrate 104 are not shown for illustration purposes.

The package substrate 104 is formed as a multi-layer laminate structure having conductive features separated by a non-conductive material. In this embodiment, the package substrate 104 includes a plurality of connector pads 206 located at the bottom side. The connector pads 206 are interconnected to the conducive die connectors 202 by way of one or more conductive layers (not shown) of the package substrate 104, for example. In this embodiment, the connector pads 206 are formed from a copper material. The connector pads 206 may be treated with an anti-tarnish or preservative material in a manner that protects exposed surfaces of the connector pads 206 from oxidation or corrosion. The preservative material may be in the form of deposited gold, palladium, and nickel materials, for example. In other embodiments, the connector pads may be formed from other suitable metal materials, for example. Interconnect features such as conductive vias and traces embedded in the package substrate 104 are not shown for illustration purposes.

Figure 3:
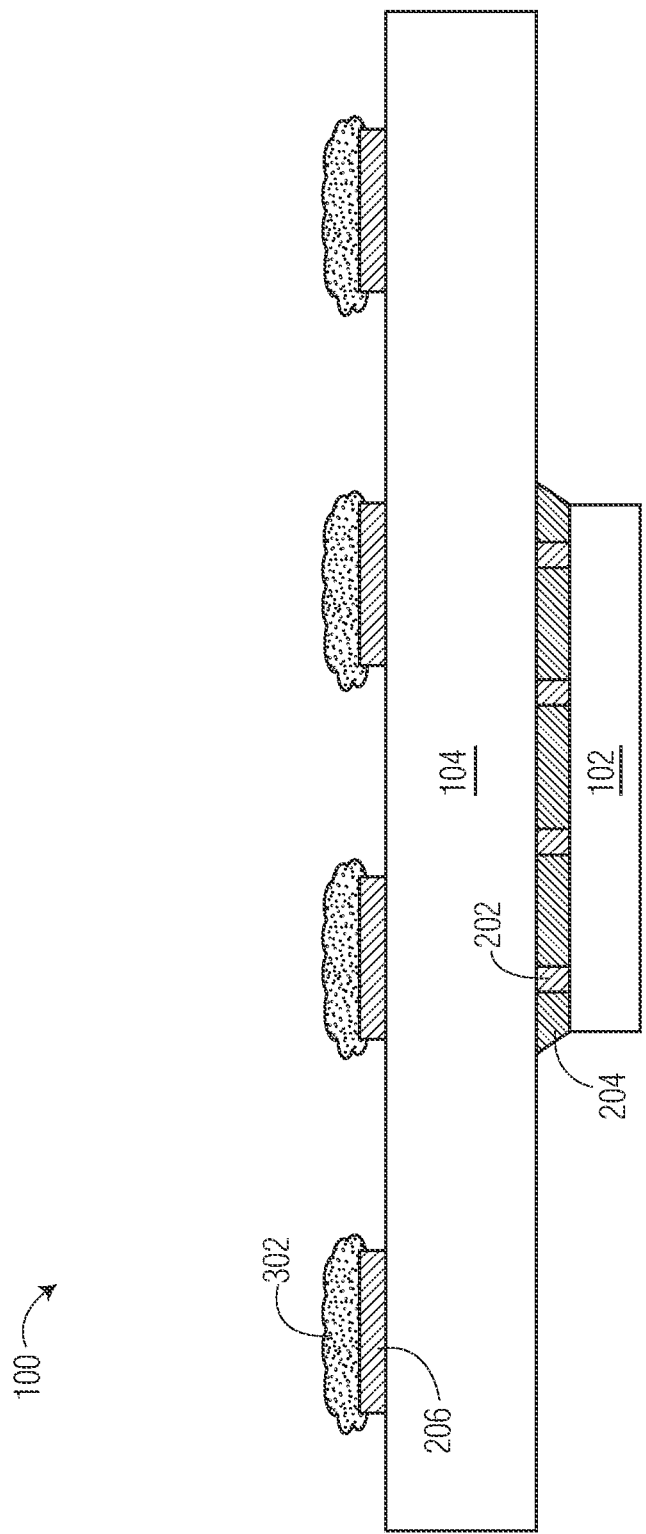

FIG. 3 illustrates, in a simplified bottom-side-up cross-sectional view, the example packaged semiconductor device 100 at a subsequent stage of manufacture in accordance with an embodiment. At this stage, a joint protection paste 302 is applied onto the connector pads 206 of the package substrate 104. The joint protection paste 302 may be stencil printed onto the connector pads 206, for example. In this embodiment, the joint protection paste 302 includes a combination of epoxy material and solder particles. The combination may include equal parts of epoxy material and solder particles by volume, for example.

Figure 4:
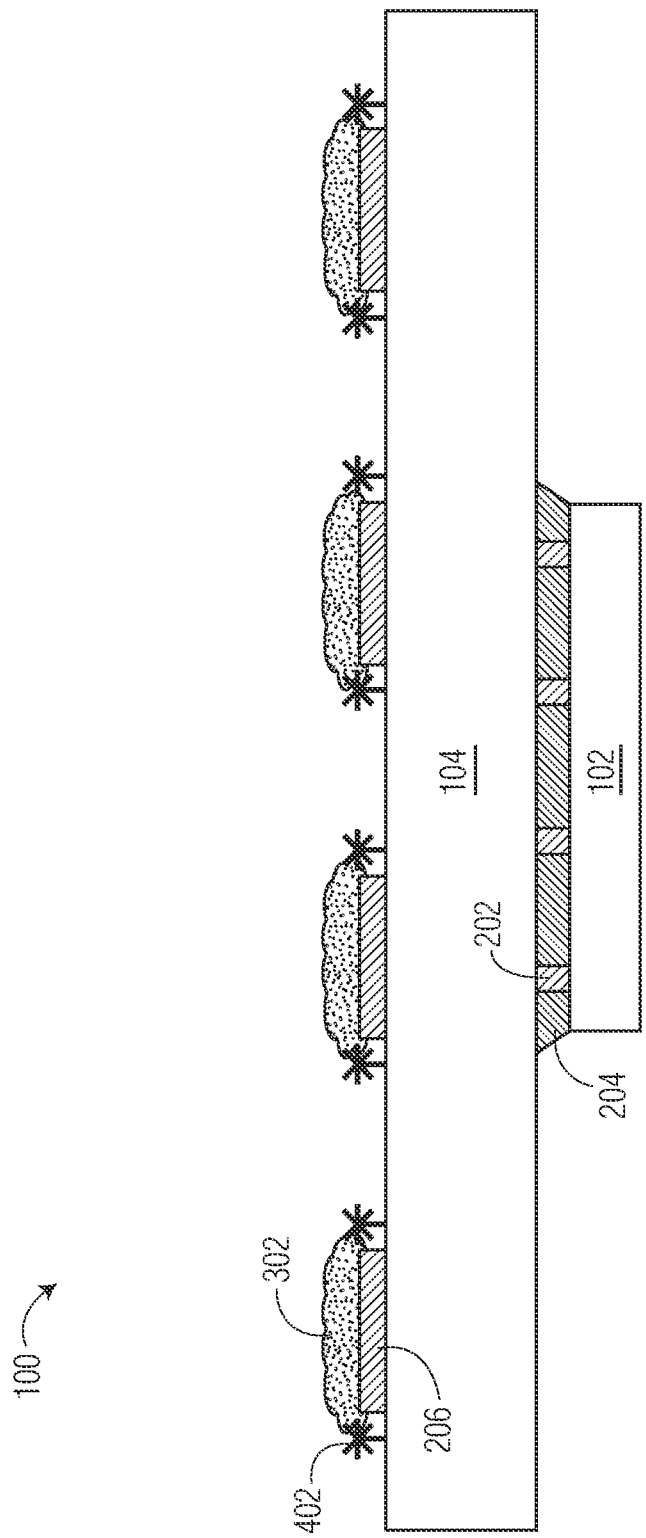

FIG. 4 illustrates, in a simplified bottom-side-up cross-sectional view, the example packaged semiconductor device 100 at a subsequent stage of manufacture in accordance with an embodiment. At this stage, a plurality of reinforcement structures 402 is placed on the package substrate 104. Each reinforcement structure 402 substantially surrounds a conductive pad 206 and respective joint protection paste 302. In the embodiment depicted in FIG. 4, the reinforcement structures 402 are placed after the joint protection paste 302 is applied. In other embodiments, the reinforcement structures 402 may be placed before the joint protection paste 302 is applied onto the connector pads 206.

In this embodiment, the reinforcement structures 402 are formed from metal or alloy material. The metal or alloy material may be coated with a non-wettable material such as titanium to prevent reaction with solder, for example. In some embodiments, the reinforcement structures 402 may be formed from a rigid material other than metal or alloy materials. The reinforcement structures 402 may include one or more adhesion promoting features (e.g., fins, undulations, texture, roughness). Cross-sectional views of example reinforcement structures 402 are depicted in FIG. 9.

Figure 5:
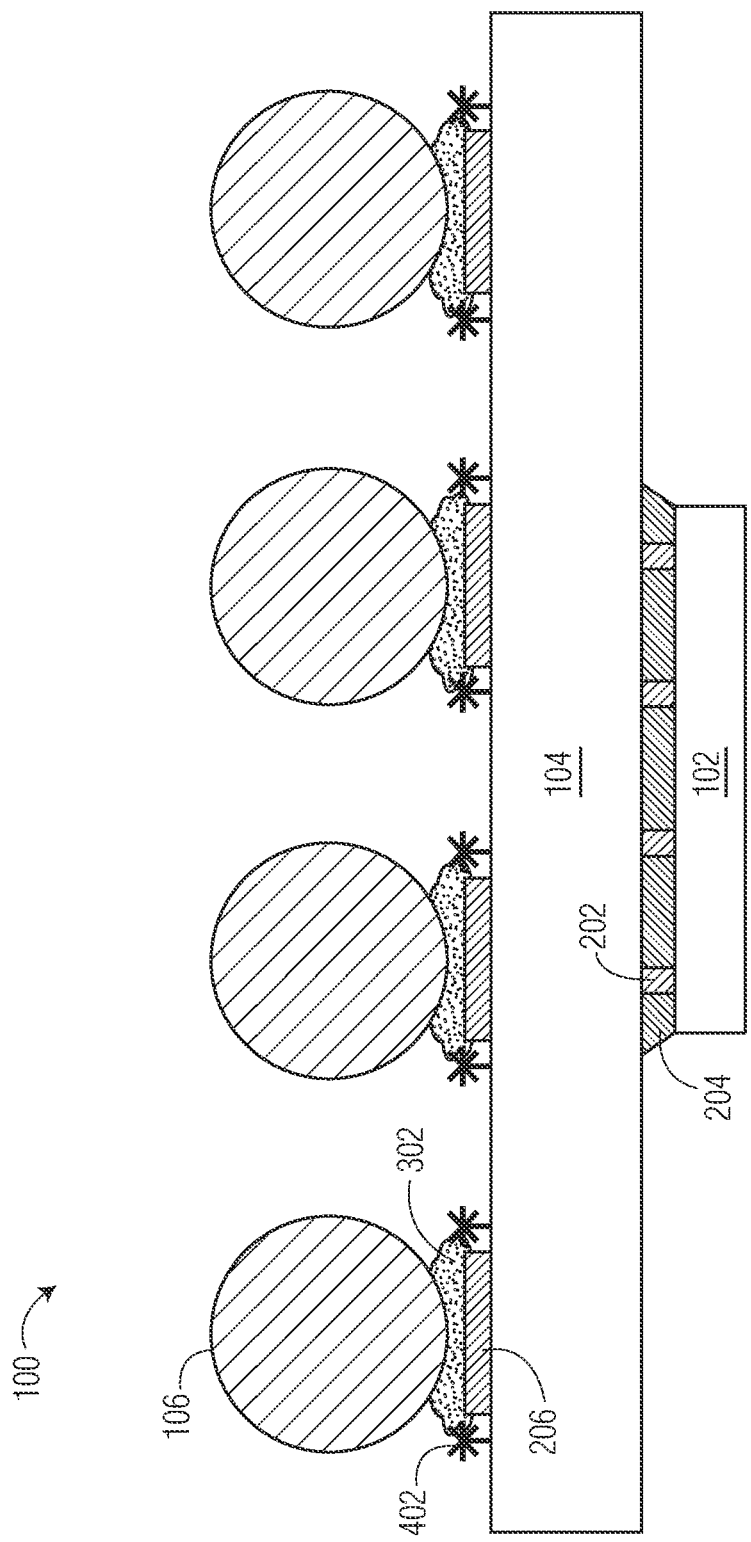

FIG. 5 illustrates, in a simplified bottom-side-up cross-sectional view, the example packaged semiconductor device 100 at a subsequent stage of manufacture in accordance with an embodiment. At this stage, a plurality of conductive connectors 106 is placed on the joint protection paste 302 applied on the respective conductive pads 206. The conductive connectors 106 may be formed in any suitable conductive connector structures such as solder or solder alloy balls, gold studs, copper pillars, and the like. In this embodiment, the conductive connectors 106 are formed as ball connectors, for example. Because the joint protection paste 302 has a sticky property, the conductive connectors 106 stay where placed and do not move around between stages of manufacture.

Figure 6:
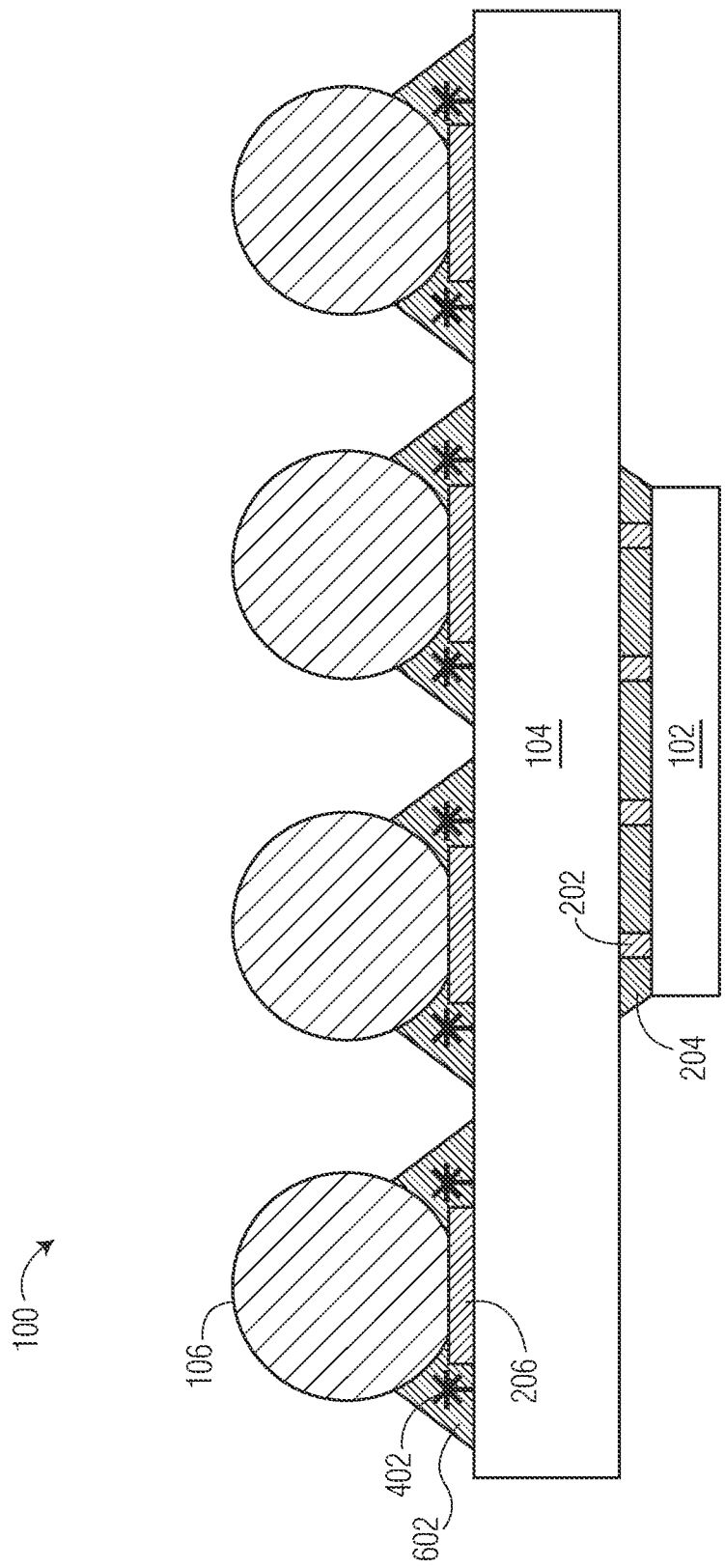

FIG. 6 illustrates, in a simplified bottom-side-up cross-sectional view, the example packaged semiconductor device 100 at a subsequent stage of manufacture in accordance with an embodiment. At this stage, the device 100 is subjected to a heat treatment to reflow the joint protection paste (302) and form a conductive bond between the conductive connectors 106 and the connector pads 206. As the joint protection paste reflows, the conductive connectors 106 are conductively attached to the connector pads 206 by way of the solder particles while epoxy collars 602 are formed around a perimeter of the conductive connectors 106 to package substrate 104 transition.

The applied heat treatment causes the joint protection paste to flow around and cover the reinforcement structures 402 to substantially embed the reinforcement structures 402 within the collars 602 as the collars are formed. The applied heat treatment further causes the collars 602 to harden with the reinforcement structures 402 embedded thus forming substantially rigid reinforced connector structures. By reinforcing the connector structures in this manner, higher reliability of the packaged semiconductor device 100 is attained.

Figure 7:
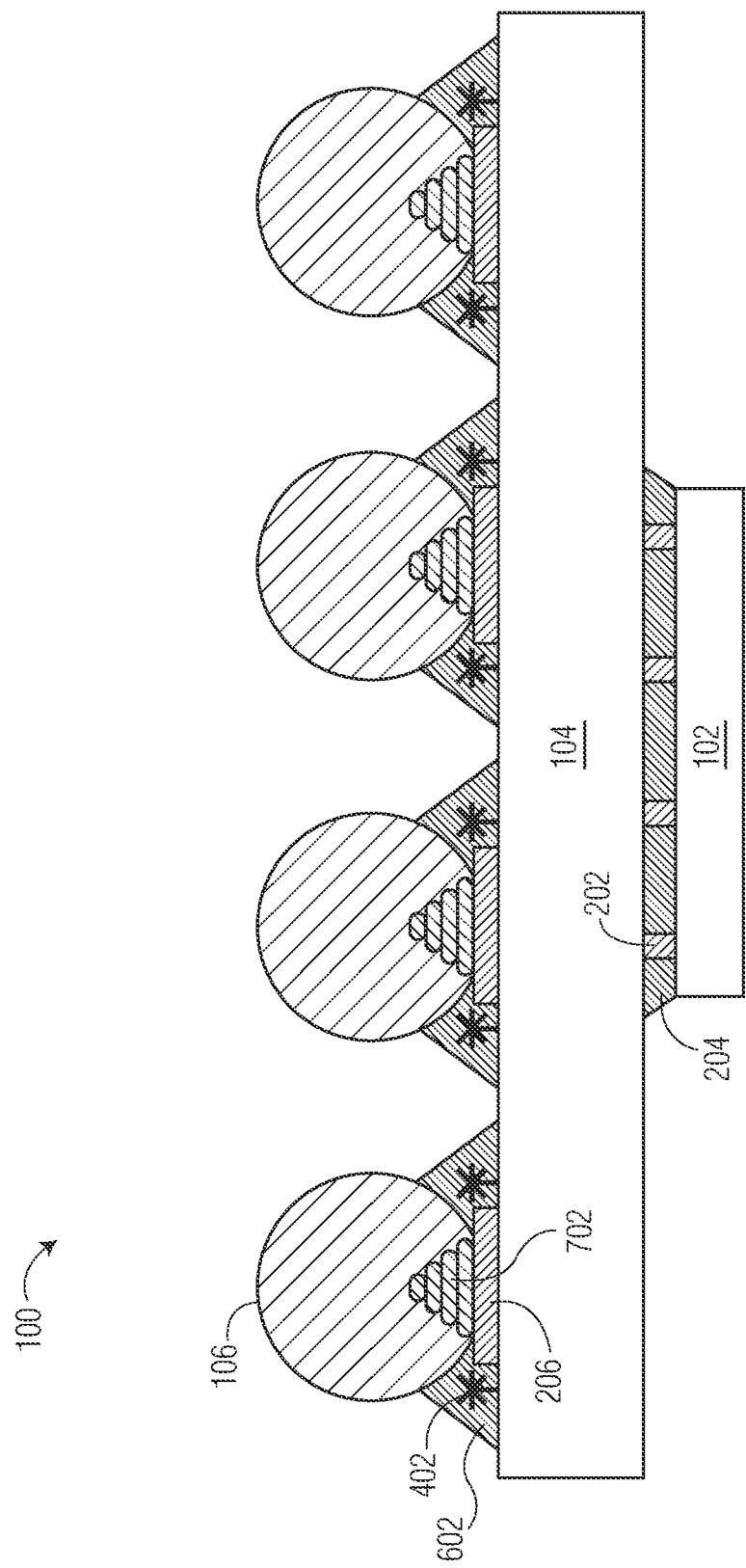
FIG. 7 illustrates, in a simplified cross-sectional view, an alternative example packaged semiconductor device in accordance with an embodiment.

FIG. 7 illustrates, in a simplified bottom-side-up cross-sectional view, the example packaged semiconductor device 100 at an alternative stage of manufacture in accordance with an embodiment. At this stage, the device 100 includes a coil structure 702 embedded in a base region of the conductive connectors 106 affixed to the package substrate 104. In this embodiment, the coil structures 702 are placed onto the connector pads 206 and the joint protection paste 302 is applied over the coil structures 702 and the connector pads 206. During the heat treatment to reflow the joint protection paste (302) and form a conductive bond between the conductive connectors 106 and the connector pads 206, the coil structures 702 embed within the base region of the conductive connectors 106. In this embodiment, the embedded coil structures 702 are configured to serve as a crack arrestor to suppress propagation of a crack that may form in a high stress area of the conductive connectors 106. The smooth rounded surface of the coil structures 702 prevents stress concentration within the conductive connectors 106, thus, potential crack initiation is virtually eliminated at the interface between the conductive connectors and surface of coil structures. By embedding the coil structures 702 within the conductive connectors 106 in this manner, higher reliability of the packaged semiconductor device 100 is further attained.

Figure 8:
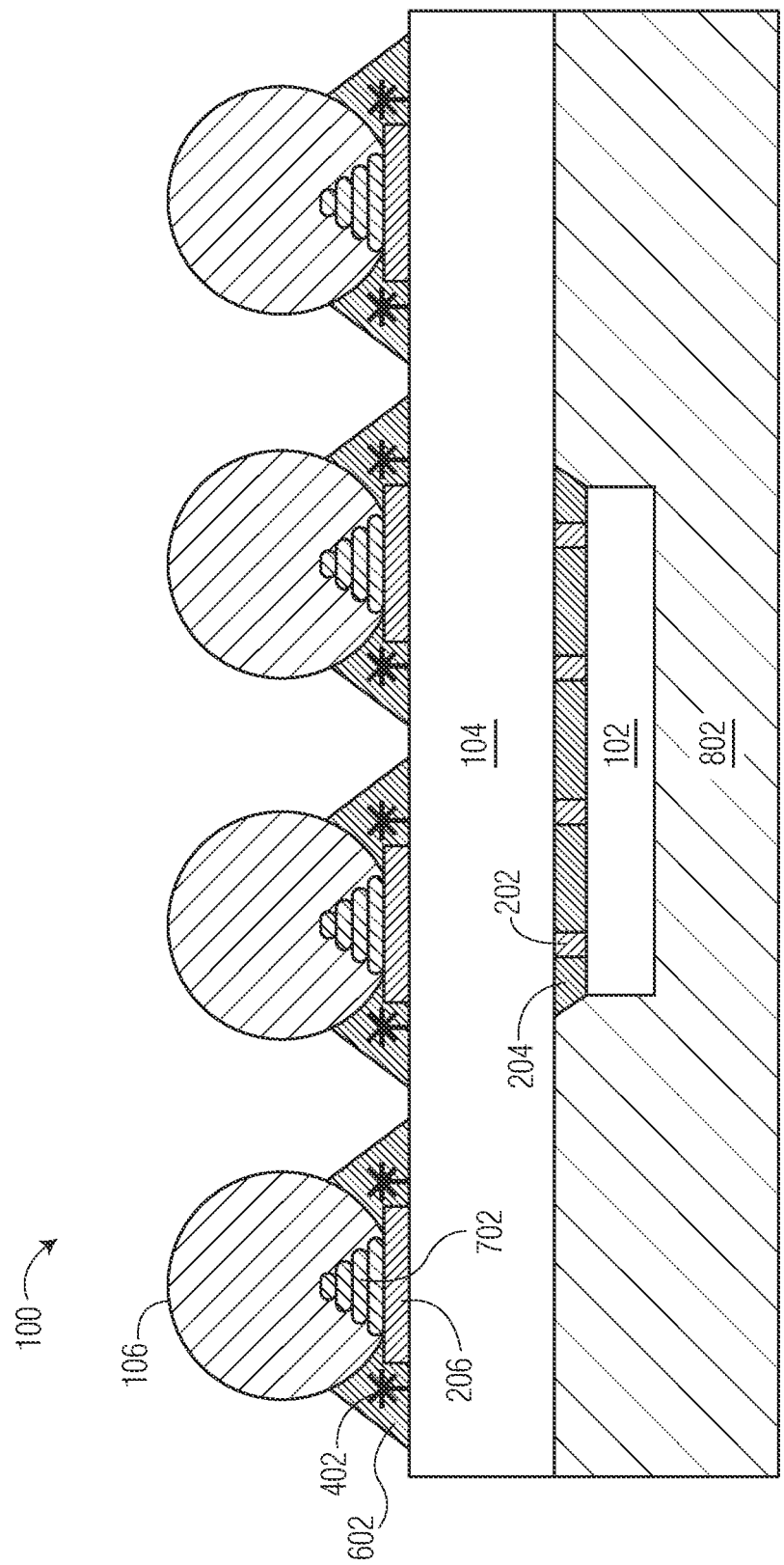
FIG. 8 illustrates, in a simplified cross-sectional view, an alternative example packaged semiconductor device in accordance with an embodiment.

FIG. 8 illustrates, in a simplified bottom-side-up cross-sectional view, the example packaged semiconductor device 100 at an alternative stage of manufacture in accordance with an embodiment. At this stage, the device 100 is encapsulated with an encapsulant (e.g., epoxy material) 802 which encapsulates the semiconductor die 102 and a portion of the top side of the package substrate 104. After the semiconductor die 102 is affixed to the package substrate 104 as depicted in FIG. 2, the semiconductor die 102 and the exposed top portion of the package substrate 104 are encapsulated. After encapsulation, the manufacturing process continues with the stages of manufacture depicted in FIG. 3 through FIG. 7, for example, to form the packaged semiconductor device 100 depicted in FIG. 8.

FIG. 9 illustrates, in simplified cross-sectional views, example reinforcement structures 900 in accordance with an embodiment. In some embodiments, reinforcement structures depicted as a star shape 902 (e.g., reinforcement structures 402 of FIG. 4 through FIG. 8) may be formed in alternative shapes or profiles such as a "Y" shape 904, a circular or oval shape 906, and a pyramid shape 908, for example. Each reinforcement structure may include adhesion promoting features such as fins, undulations, texture, and surface roughness. For example, the star-shaped and the Y-shaped reinforcement structures include adhesion promoting fins depicted as fingers in the cross-sectional views. The adhesion promoting features allow for the joint protection paste to have improved wetting and adherence to the reinforcement structure during a heat treatment to reflow the joint protection paste, for example.

The reinforcement structures 902-908 may be formed from metal, alloy, or other suitable rigid material. The reinforcement structures 902-908 may be treated with a non-wettable material to prevent reaction with solder, for example. Each of the example reinforcement structures 902-908 alternatively may be affixed to the package substrate (104) by way of an adhesive 910. In other embodiments, the reinforcement structures may be formed in other suitable shapes to further reinforce the conductive connector structure and promote adhesion, for example.

Generally, there is provided, a packaged semiconductor device including a semiconductor die affixed to a package substrate; a conductive connector affixed to the package substrate; a collar formed around a perimeter of the conductive connector at a conductive connector to package substrate transition; and a reinforcement structure embedded in the collar, the reinforcement structure substantially surrounding the conductive connector at the conductive connector to package substrate transition. The package substrate may include a conductive pad, the conductive connector conductively connected to the conductive pad. The reinforcement structure together with the collar may be configured as a crack arrest feature. The reinforcement structure may be formed from a metal material. The reinforcement structure may include one or more adhesion promoting features. The packaged semiconductor device may further include a plurality of conductive die connectors, the conductive die connectors configured to form conductive connections between the semiconductor die and the package substrate. The packaged semiconductor device may further include an epoxy material underfilled between the semiconductor die and the package substrate. The conductive connector affixed to the package substrate may be characterized as a solder ball. The packaged semiconductor device may further include a coil structure embedded in a base region of the conductive connector affixed to the package substrate.

In another embodiment, there is provided, a method including affixing a semiconductor die on a package substrate; applying a joint protection paste over a conductive pad formed on the package substrate; placing a reinforcement structure on the package substrate, the reinforcement structure substantially encircling the joint protection paste and the conductive pad; placing a conductive connector on the joint protection paste; and applying heat treatment causing the joint protection paste to form a collar around the conductive connector and the conductive connector to attach to the conductive pad. The joint protection paste may include an epoxy material and solder particles. The applying heat treatment may further cause the formed collar to harden with the reinforcement structure embedded. The reinforcement structure may be formed from a metal material and include one or more adhesion promoting features. The affixing the semiconductor die may include forming conductive connections between the semiconductor die and the package substrate by way of conductive die connectors; and underfilling with an epoxy material a gap between the semiconductor die and the package substrate. The method may further include placing a coil structure over the conductive pad, the applying heat treatment further causing the coil structure to embed in a base region of the conductive connector.

In yet another embodiment, there is provided, a packaged semiconductor device including a semiconductor die affixed to a first side of a package substrate; a conductive connector affixed to a second side of the package substrate; a hardened collar formed around a perimeter of the conductive connector at a conductive connector to package substrate transition; and a reinforcement structure embedded in the hardened collar, the reinforcement structure substantially surrounding the conductive connector at the conductive connector to package substrate transition. A conductive pad may be formed on the second side of the package substrate, the conductive connector conductively connected to the conductive pad. The packaged semiconductor device may further include a plurality of conductive die connectors, the conductive die connectors configured to form conductive connections between the semiconductor die and the package substrate. The reinforcement structure may be formed from a metal material and include one or more adhesion promoting features. The conductive connector affixed to the package substrate may be characterized as a solder ball.

By now, it should be appreciated that there has been provided a semiconductor device package having a reinforced connector structure and method. A joint protection paste is applied to connector pads of a package substrate and ring-like reinforcement structures are placed onto the package substrate to substantially encircle the joint protection paste and respective connector pads. Conductive connectors are placed onto the joint protection paste. A heat treatment is applied to the device package to reflow the joint protection paste and to form a conductive bond between the conductive connectors and the connector pads. A rigid collar with embedded reinforcement structure is formed around a perimeter of each conductive connector. By reinforcing the connector structures in this manner, device package reliability is improved.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
   a semiconductor die affixed to a package substrate;
   a conductive connector affixed to the package substrate;
   a collar formed around a perimeter of the conductive connector adjacent to the conductive connector and the package substrate; and
   a reinforcement structure embedded in the collar, the reinforcement structure substantially surrounding the conductive connector adjacent to the conductive connector and the package substrate.

2. The packaged semiconductor device of claim 1, wherein the package substrate includes a conductive pad, the conductive connector conductively connected to the conductive pad.

3. The packaged semiconductor device of claim 1, wherein the reinforcement structure together with the collar are configured to suppress propagation of a crack.

4. The packaged semiconductor device of claim 1, wherein the reinforcement structure is formed from a metal or metal alloy.

5. The packaged semiconductor device of claim 1, wherein the reinforcement structure includes one or more adhesion promoting features.

6. The packaged semiconductor device of claim 1, further comprising a plurality of conductive die connectors, the conductive die connectors configured to form conductive connections between the semiconductor die and the package substrate.

7. The packaged semiconductor device of claim 1, further comprising an epoxy underfill material disposed between the semiconductor die and the package substrate.

8. The packaged semiconductor device of claim 1, wherein the conductive connector affixed to the package substrate is characterized as a solder ball.

9. The packaged semiconductor device of claim 1, further comprising a coil structure embedded in a base region of the conductive connector affixed to the package substrate.

10. The packaged semiconductor device of claim 1, wherein the reinforcement structure is formed from a metal or metal alloy.

11. The packaged semiconductor device of claim 1, wherein the conductive connector affixed to the package substrate is characterized as a solder ball.

12. A method comprising:
    affixing a semiconductor die on a package substrate;
    applying a joint protection paste over a conductive pad formed on the package substrate;
    placing a reinforcement structure on the package substrate, the reinforcement structure substantially encircling the joint protection paste and the conductive pad, the joint protection paste including a combination of an epoxy material and solder particles;
    placing a conductive connector on the joint protection paste; and
    applying heat treatment causing the joint protection paste to form a collar around the conductive connector and the conductive connector to attach to the conductive pad.

13. The method of claim 12, wherein the joint protection paste includes an epoxy material and solder particles.

14. The method of claim 12, wherein the applying heat treatment further causes the formed collar to harden with the reinforcement structure embedded.

15. The method of claim 12, wherein the reinforcement structure is formed from a metal or metal alloy.

16. The method of claim 12, wherein affixing the semiconductor die on the package substrate includes:
    forming conductive connections between the semiconductor die and the package substrate by way of conductive die connectors; and
    dispensing an epoxy underfill material to fill a gap between the semiconductor die and the package substrate.

17. The method of claim 12, further comprising placing a coil structure over the conductive pad, the applying heat treatment further causing the coil structure to embed in a base region of the conductive connector.

18. A packaged semiconductor device comprising:
    a semiconductor die affixed to a first side of a package substrate;
    a conductive connector affixed to a second side of the package substrate;
    a hardened collar formed around a perimeter of the conductive connector a adjacent to the conductive connector and the package substrate; and
    a reinforcement structure embedded in the hardened collar, the reinforcement structure substantially surrounding the conductive connector adjacent to the conductive connector and the package substrate.

19. The packaged semiconductor device of claim 18, wherein a conductive pad is formed on the second side of the package substrate, the conductive connector conductively connected to the conductive pad.

20. The packaged semiconductor device of claim 18, further comprising a plurality of conductive die connectors, the conductive die connectors configured to form conductive connections between the semiconductor die and the package substrate.

* * * * *